(12) United States Patent
Liu et al.

(10) Patent No.: US 11,728,006 B2
(45) Date of Patent: *Aug. 15, 2023

(54) GROWN BAD BLOCK MANAGEMENT IN A MEMORY SUB-SYSTEM

(71) Applicant: Micron Technology, Inc., Boise, ID (US)

(72) Inventors: Tao Liu, San Jose, CA (US); Chun Sum Yeung, Milpitas, CA (US); Xiangang Luo, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/747,598

(22) Filed: May 18, 2022

(65) Prior Publication Data

US 2022/0277802 A1   Sep. 1, 2022

Related U.S. Application Data

(63) Continuation of application No. 16/903,066, filed on Jun. 16, 2020, now Pat. No. 11,373,729.

(51) Int. Cl.
*G11C 29/00*   (2006.01)
*G11C 29/52*   (2006.01)
*G11C 29/44*   (2006.01)

(52) U.S. Cl.
CPC ............. *G11C 29/76* (2013.01); *G11C 29/44* (2013.01); *G11C 29/52* (2013.01); *G11C 29/808* (2013.01); *G11C 29/886* (2013.01)

(58) Field of Classification Search
CPC ....... G11C 29/76; G11C 29/808; G11C 29/62; G11C 29/44; G11C 29/886
See application file for complete search history.

(56) References Cited

U.S. PATENT DOCUMENTS

| | | | |
|---|---|---|---|
| 2008/0112238 A1 | 5/2008 | Kim et al. | |
| 2008/0183955 A1 | 7/2008 | Yang et al. | |
| 2013/0019049 A1 | 1/2013 | Yeh | |
| 2015/0092494 A1* | 4/2015 | Rhie | G11C 16/16 365/185.11 |
| 2021/0391029 A1 | 12/2021 | Liu et al. | |

* cited by examiner

*Primary Examiner* — Samir W Rizk
(74) *Attorney, Agent, or Firm* — Schwegman Lundberg & Woessner, P.A.

(57) ABSTRACT

A replacement block pool for a memory device is established. The replacement block pool comprises one or more valid blocks from a set of valid blocks in the memory device determined based on a constraint defining a minimum number of valid blocks for the memory device. A grown bad block is detected in the memory device. The grown bad block is replaced with a replacement block from the replacement block pool in response to detecting the grown bad block.

20 Claims, 7 Drawing Sheets

GROWN BAD BLOCK MANAGEMENT IN A MEMORY SUB-SYSTEM

PRIORITY APPLICATION

This application is a continuation of U.S. application Ser. No. 16/903,066, filed Jun. 16, 2020, which is incorporated herein by reference in its entirety.

TECHNICAL FIELD

Embodiments of the disclosure relate generally to memory sub-systems and, more specifically, grown bad block (GBB) management in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
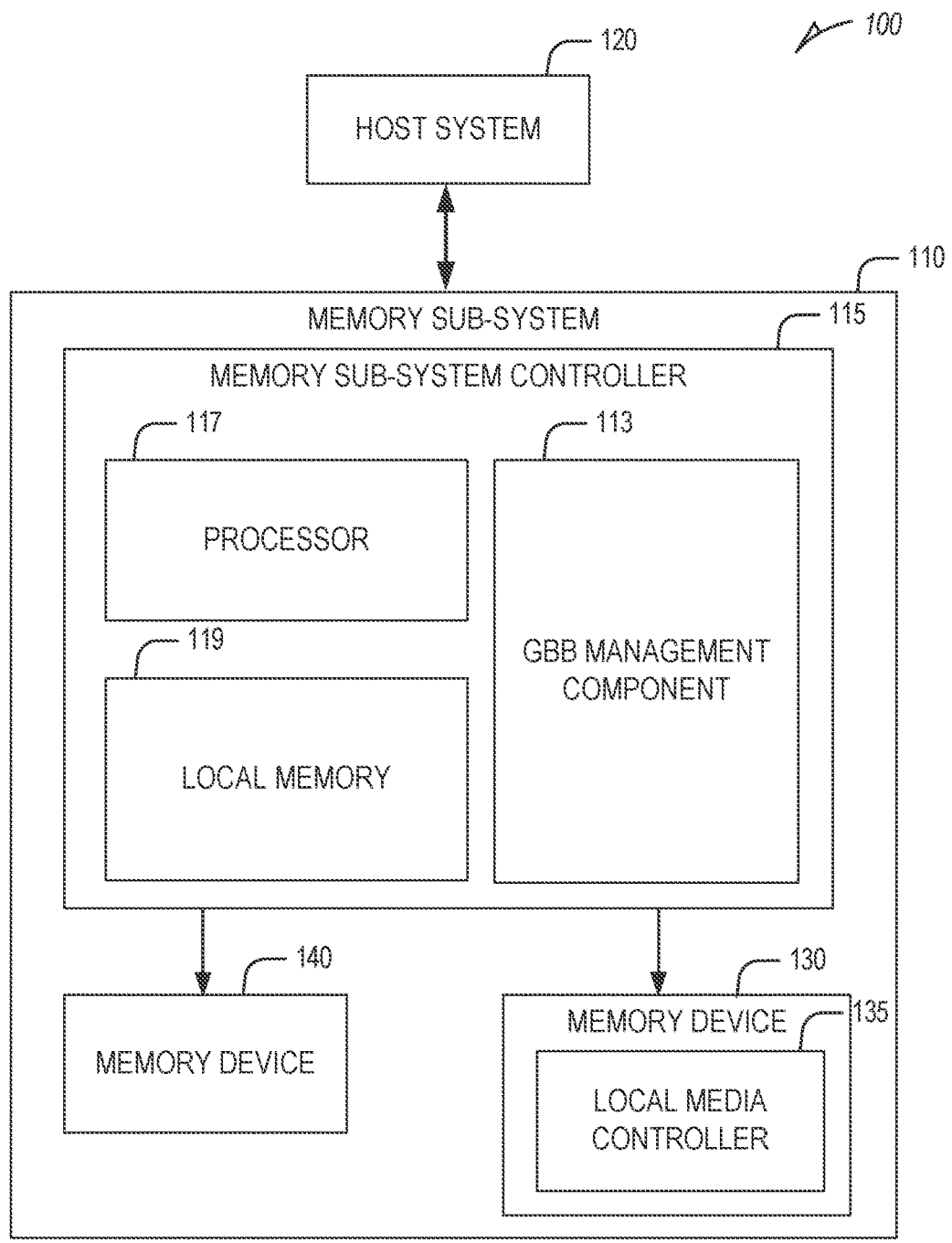
FIG. 1 is a block diagram illustrating an example computing system that includes a memory sub-system, in accordance with some embodiments of the present disclosure.

Aspects of the present disclosure are directed to grown bad block (GBB) management in a memory sub-system. A memory sub-system can be a storage device (e.g., solid-state drive (SSD)), a memory module, or a combination of a storage device and memory module. Examples of other storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device. Other examples of non-volatile memory devices are described below in conjunction with FIG. 1. Each of the non-volatile memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various memory access operations can be performed on the memory cells. Data can be written to, read from, and erased from memory cells. Memory cells can be grouped into a write unit, such as a page. For some types of memory devices, a page is the smallest write unit. A page size represents a particular number of cells of a page.

For some types of memory devices (e.g., NAND), memory cells can be grouped into an erase unit, such as a physical block, which is a group of pages. A physical block is a 2-dimensional memory array of pages (rows of cells) and strings (columns of cells). Data can be written to a block, page-by-page. Data can be erased at a block level. However, portions of a block cannot be erased.

A bad block (also referred to herein as "invalid block") hereinafter refers to block that is no longer reliable for storing or retrieving data, for example, due to a defect (e.g., manufacturing defect) or due to wear, and may incorrectly store bit values. An incorrect bit value is hereinafter referred to as an invalid bit. A grown bad block (GBB) hereinafter refers to a block being unreliable due to wear. A grown bad block can be identified based on a threshold (e.g., bit error rates (BER) threshold).

Bad blocks can be present when a device is shipped or may develop over the lifetime of a device. For example, during manufacture of a NAND, a certain number of memory blocks are factory generated bad blocks and are marked as "manufacturing bad blocks," an indication of which is typically stored within a dedicated region of the memory blocks. Memory blocks that are originally "good" valid blocks (i.e., reliable blocks) may eventually become GBBs as they wear out during system usage. Once a GBB in a memory device is identified, the memory sub-system decides how to handle the GBB to minimize system impacts and maximize system lifetime. Due to data structure designs, GBBs need to be properly replaced by reliable blocks so that the memory sub-system can continue to operate based on the same data structures. However, there is a limit on how many GBBs can be replaced due to other considerations, such as availability of good blocks and system performance requirements.

Aspects of the present disclosure address with handling GBBs in a memory sub-system using a GBB management component to detect and replace GBBs in a memory device. The GBB management component maintains a replacement block pool from which replacement blocks can be selected to replace GBBs in the memory device. Replacement blocks in the replacement block pool may be either extra valid blocks or free valid blocks. The memory device is manufactured to include a set of blocks and design specification define a constraint on a minimum number of valid blocks. "Extra" valid blocks, as referenced herein, refers to blocks that are in excess of the minimum number of valid blocks. A "free" valid block, as referenced herein, refers to an unused valid block that is empty and not currently allocated for use.

In replacing a GBB, the GBB management component assesses whether the replacement pool includes at least one extra valid block, and if so, the GBB management component replaces the GBB with an extra valid block. If there are no extra valid blocks in the replacement block pool, the GBB management component replaces the GBB with a free block from the replacement block pool. Depending on the embodiment, the GBB management component can replace blocks in the replacement block pool upon using a replacement block from the pool, or after the replacement block pool is emptied. If there are no additional replacement blocks available to add to the replacement block pool, the GBB management component places the memory device in a read-only mode.

By replacing GBBs with a replacement block from a replacement block pool of extra valid blocks and free blocks, the GBB management component extends memory sub-system lifetime while at the same time reducing memory sub-system performance impact. The GBB management component extends memory sub-system lifetime by allowing the memory sub-system to continue to operate using the same data structures despite the occurrence of one or more GBBs in a memory device of the memory sub-system. The GBB management component reduces system performance impact by only replacing GBBs with replacement blocks when the memory device can continue to operate in accordance with system performance requirements (e.g., by maintaining a threshold number of valid blocks for use in normal operation).

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a serial advanced technology attachment (SATA) interface, a peripheral component interconnect express (PCIe) interface, USB interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. For example, the memory device can include a set of blocks. Design specifications may define a constraint on a minimum number of valid blocks for the memory device 130 that may be different from the number of blocks in the set of blocks on the device.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operate in conjunction with memory sub-system controller 115 to execute operations on one or more memory cells of the memory devices 130.

As noted above, any one of the memory devices 130 or 140 can include arrays of memory cells grouped into blocks. Properly functioning blocks that store valid data are referred to as valid blocks. A grown bad block (GBB) can be detected in one of the memory devices 130 or 140 based on a failure or defect in the block that results in one or more bits being invalid. Hence, a GBB can be a failed or defective block. A GBB does not affect the performance of valid blocks because it is isolated from the common source line by a select transistor. However, the underlying data stored by the block can still be recovered and used by copying it to a replacement block. The memory sub-system 110 also includes a GBB management component 113 that is responsible for managing and replacing GBBs in the memory sub-system 110

To manage GBBs, the GBB management component 113 maintains one or more replacement block pools from which replacement blocks can be selected to replace GBBs in one of the memory devices 130 or 140. Replacement blocks in each replacement block pool correspond to either extra valid blocks or free blocks. In replacing a GBB, the GBB management component 113 assesses whether a corresponding replacement pool includes at least one extra valid block, and if so, the GBB management component 113 replaces the GBB with an extra valid block. If there are no extra valid blocks in the replacement block pool, the GBB management component 113 replaces the GBB with a free block from the replacement block pool. Depending on the embodiment, the GBB management component 113 can replace blocks in the replacement block pool upon using a replacement block from the pool, or after the replacement block pool is emptied. If there are no additional replacement blocks available to add to the replacement block pool, the GBB management component 113 places the memory device in a read-only mode.

In some embodiments, the memory sub-system controller 115 includes at least a portion of the GBB management component 113. For example, the memory sub-system controller 115 can include a processor 117 (processing device) configured to execute instructions stored in local memory 119 for performing the operations described herein. In some embodiments, the GBB management component 113 is part of the host system 120, an application, or an operating system. In some embodiments, the local media controller 135 includes at least a portion of the GBB management component 113.

Figure 2A:
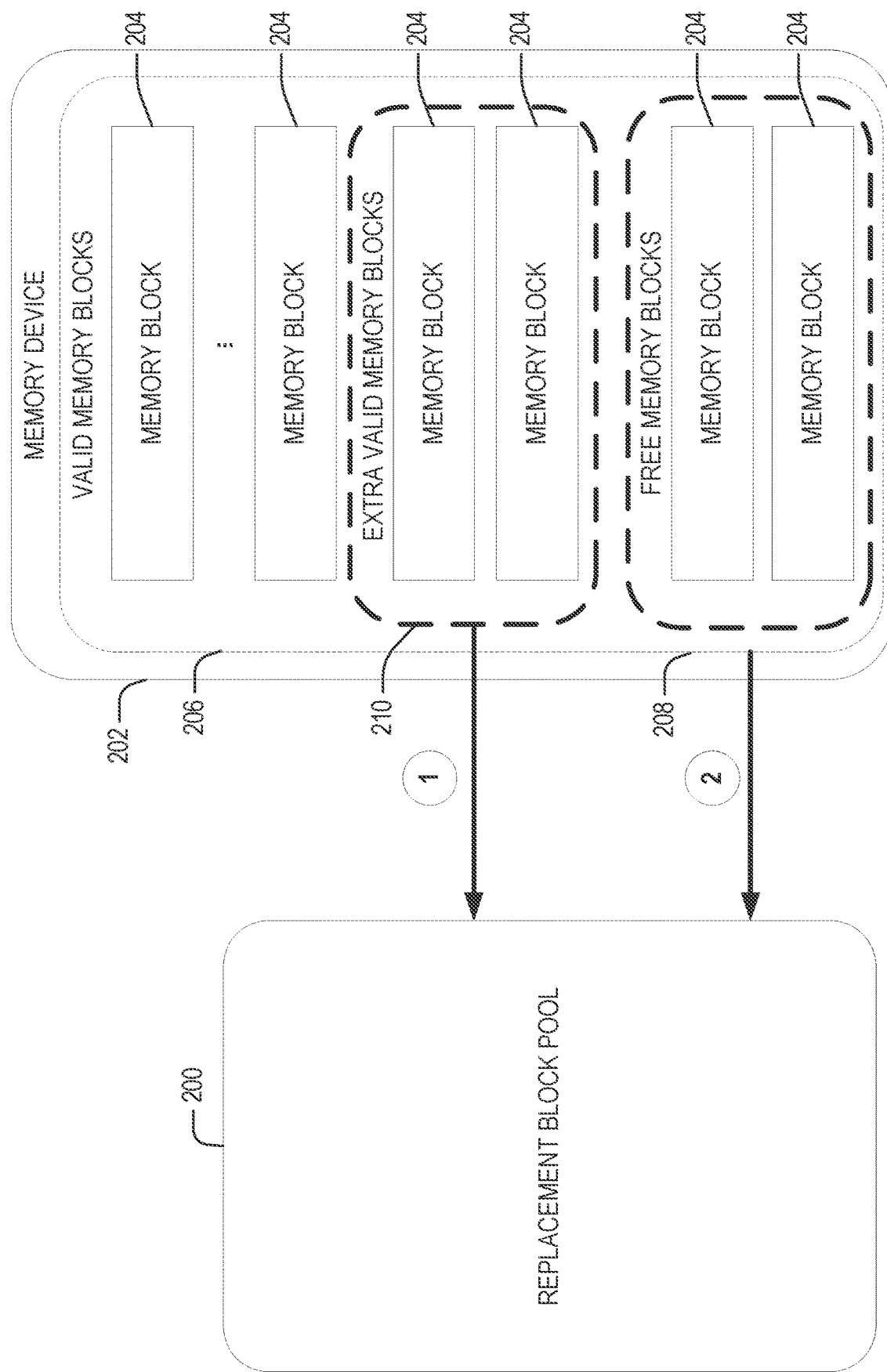
FIGS. 2A and 2B are conceptual diagrams illustrating example sources for populating a replacement block pool for replacing GBBs in a memory device, in accordance with some embodiments of the present disclosure.
Figure 2B:
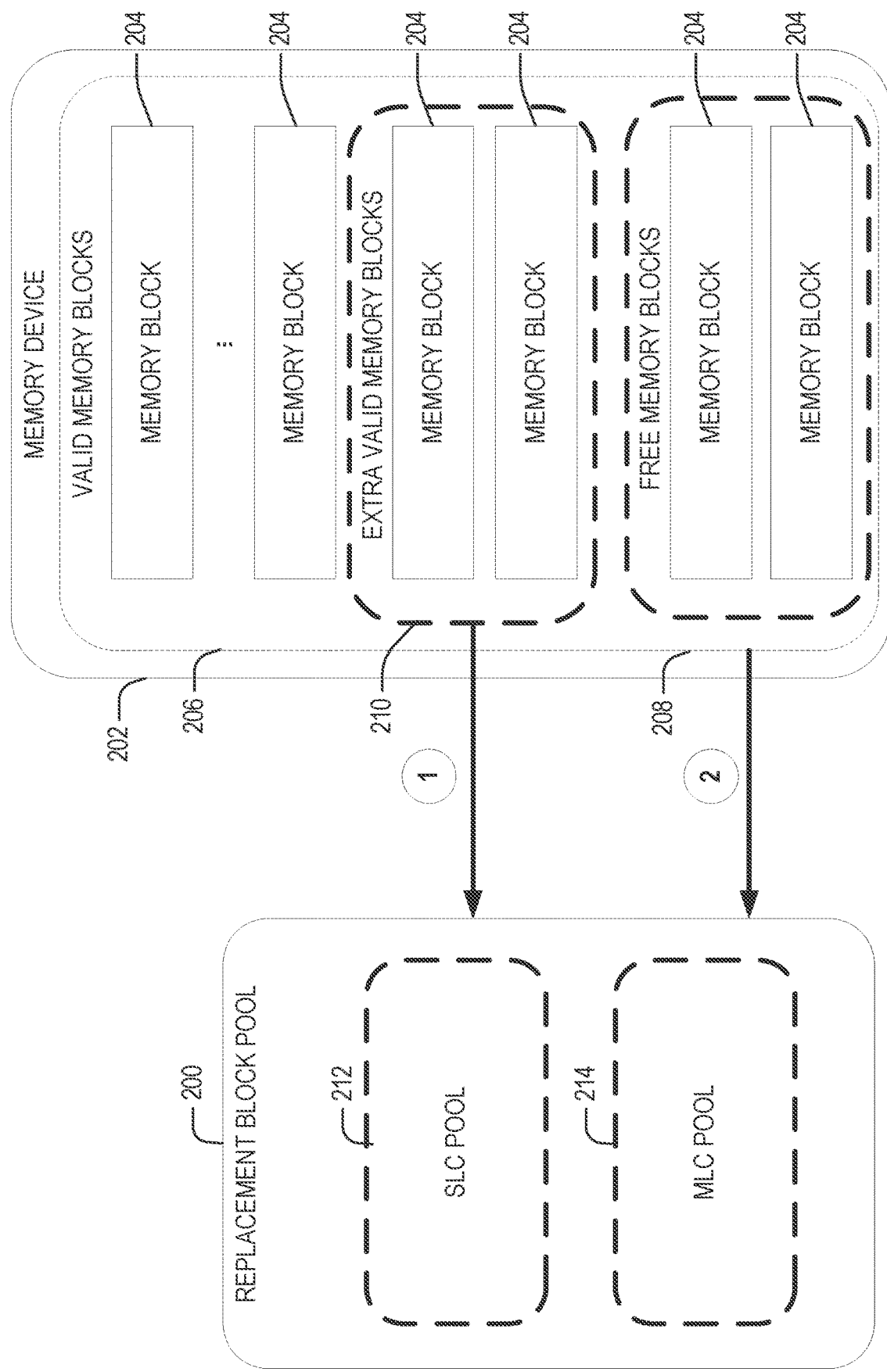

FIGS. 2A and 2B are conceptual diagrams illustrating example sources for populating a replacement block pool 200 for replacing GBBs in a memory device 202, in accordance with some embodiments of the present disclosure. In the example illustrated in FIGS. 2A and 2B, the memory device 202 is an example memory device 130 in the example form of a NAND memory device including multiple memory blocks 204. A NAND memory block 204 includes a two-dimensional (2-D) array including pages (rows) and strings (columns).

A three-dimensional (3D) NAND-type flash memory device includes multiple planes, each of which includes one or more memory blocks 204. A string includes a plurality of memory cells connected in series. Each memory cell is used to represent one or more bit values (0 or 1). A single NAND flash cell includes a transistor that stores an electric charge on a memory layer that is isolated by oxide insulating layers above and below. Generally, when there is a charge on the memory layer of a memory cell, the memory cell is programmed and recognized by a memory sub-system as a binary value of 0. When the memory layer of a memory cell has no charge, it is erased and recognized as a binary value of 1.

The memory device 202 includes a set of valid blocks 206. As an example, an area within each block may be dedicated to storing an indication of whether a block is valid. Each block in the set of valid blocks 206 can store an indication that the block is valid. In establishing the replacement block pool 200, the GBB management component 113 identifies free memory blocks 208 and extra valid memory blocks 210. Free memory blocks 208 include memory blocks that are unallocated and unused. Regarding "extra" valid memory blocks 210, according to a minimum valid block requirements of design specifications, a certain number of the set of valid blocks 206 are reserved to support normal operations of the memory device. The extra valid memory blocks 210 identified by the processing device correspond to valid blocks in the set of valid blocks 206 that exceed the minimum number of valid blocks reserved for use in normal operations.

To establish the replacement pool, the GBB management component 113 reserves the extra valid memory blocks 210 and the free memory blocks 208 for use in the replacement block pool 200. For example, the GBB management component 113 may maintain a table or other data structure to track designations of the memory blocks 204 in the memory device 202. To reserve the extra valid memory blocks 210 and the free memory blocks 208 for use in the replacement pool, the GBB management component 113 updates a table (or other data structure) to indicate that the extra valid memory blocks 210 and the free memory blocks 208 are designated as being part of the replacement block pool 200.

As noted above, the memory blocks 204 of the memory device 202 can include SLCs or MLCs. In some embodiments, replacement blocks in the replacement block pool 200 are shared between SLC and MLC memory blocks such that either MLC or SLC memory blocks can be replaced with any replacement block in the replacement pool, as needed.

In some embodiments, a first set of replacement blocks can be designated to replace SLC blocks and a second set of replacement block can be designated to replace MLC blocks. For example, as shown in FIG. 2B, consistent with some embodiments, the replacement block pool 200 can include an SLC pool 212 and an MLC pool 214. Replacement blocks in the SLC pool 212 can be used to replace only SLC blocks and replacement blocks in the MLC pool 214 can be used to replace only MLC blocks. In this example where the replacement block pool 200 includes four replacement blocks, two replacement blocks may be allocated to the SLC pool 212 and used to replace SLC GBBs and two replacement blocks may be allocated to the MLC pool 214 and used to replace MLC GBBs. In some instances, one or more blocks may be unallocated and used to replace either SLC or MLC blocks (not shown). Following the example of a four replacement block pool, two blocks can be allocated for SLC blocks, one block can be allocated for MLC blocks, and one block can be left unallocated.

Figure 3:
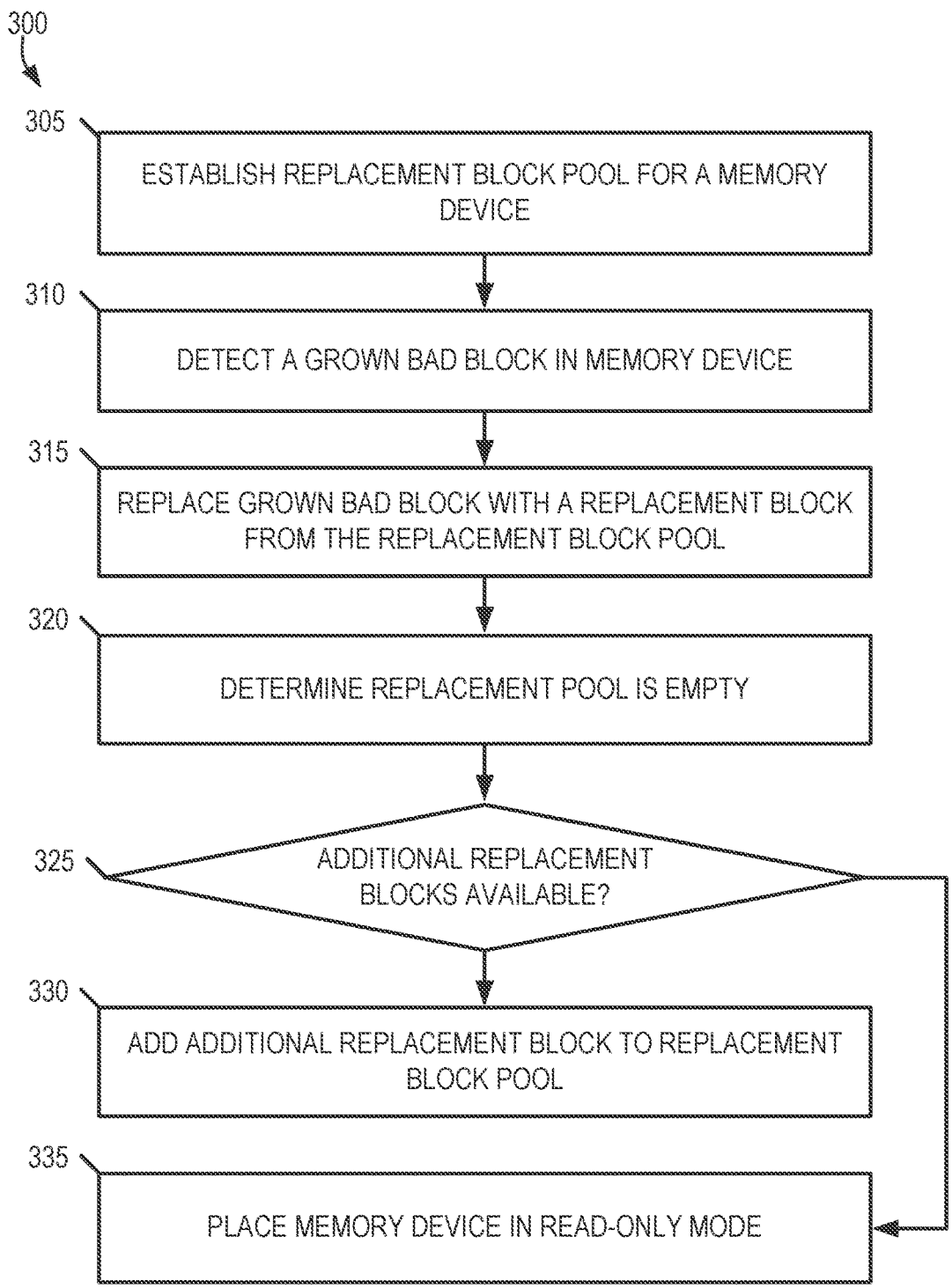
FIGS. 3-5 are flow diagrams illustrating an example method for managing GBBs, in accordance with some embodiments of the present disclosure.
Figure 4:
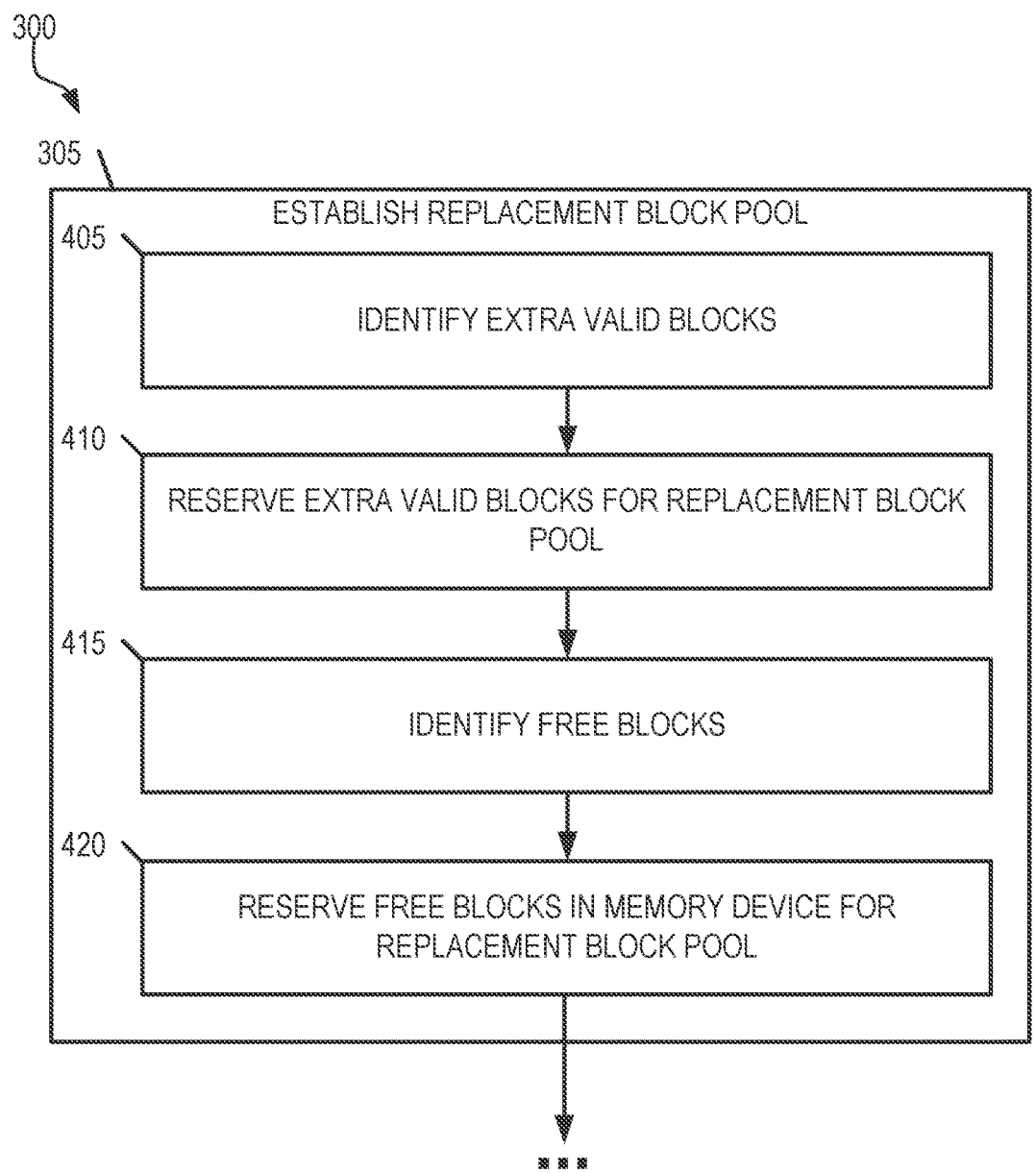
Figure 5:
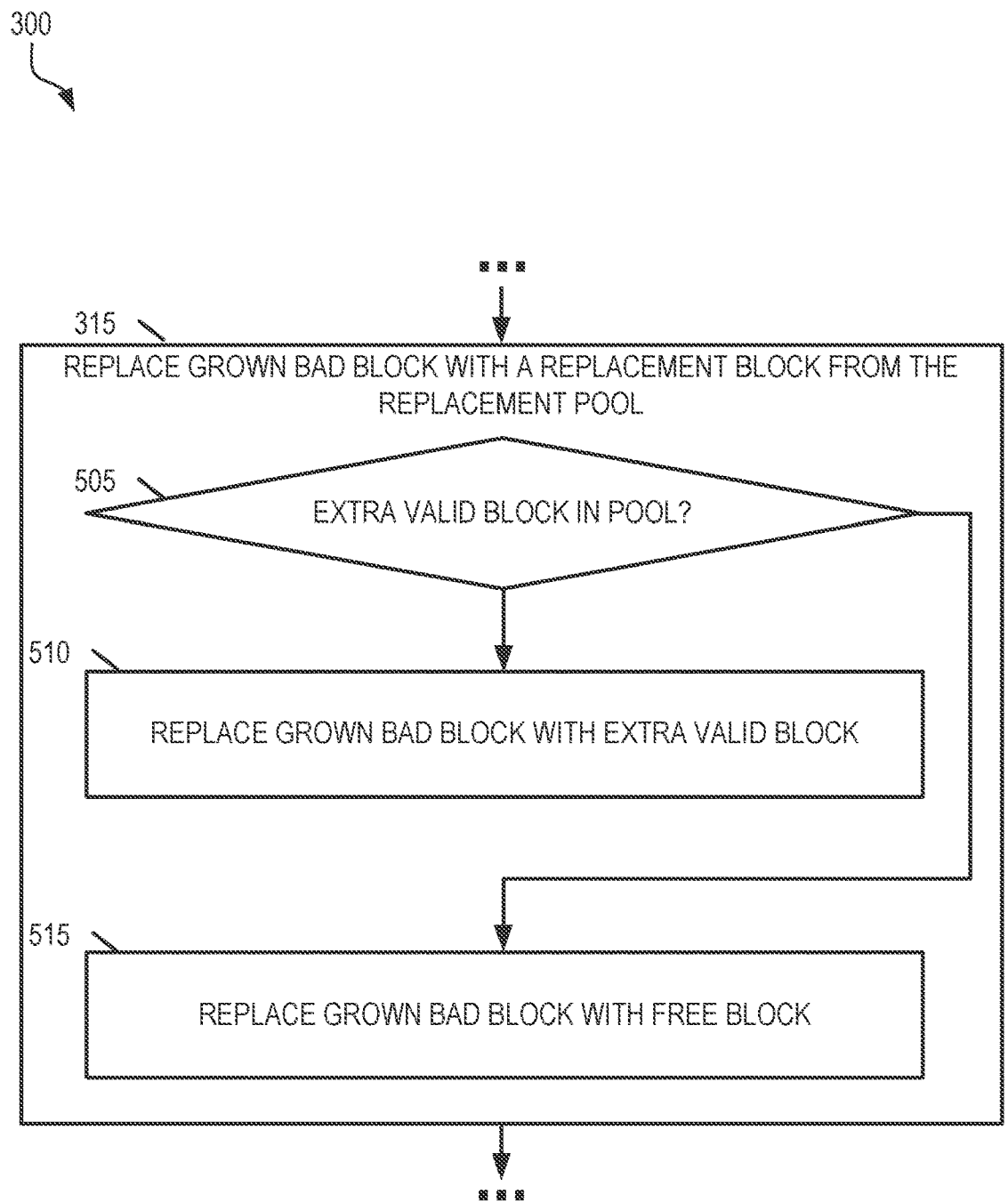

FIGS. 3-5 are flow diagrams illustrating an example method 300 for managing GBBs on a memory device (e.g., memory device 130), in accordance with some embodiments of the present disclosure. The method 300 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 300 is performed by the GBB management component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 300 begins at operation 305 where the processing device establishes a replacement block pool for a memory device of a memory sub-system. The memory device includes a set of valid blocks. Initially, the replacement block pool includes at least one or more extra valid blocks from the set of valid blocks though one or more free blocks may be added to the replacement block pool. For example, as shown in FIG. 4, the operations 405, 410, and 415 may be performed as part of operation 305 where the processing device establishes a replacement block pool.

At operation 405, the processing device identifies extra valid blocks in the memory device. In an example, the memory device includes a set of valid memory blocks ("good" blocks). The processing device can identify whether a given memory block is valid based on an indicator stored by the memory block. Per design specifications, a minimum number of the valid blocks are needed for use in normal operations of the memory device. The extra valid blocks identified by the processing device correspond to valid blocks in the set of valid blocks that exceed the minimum number of valid blocks reserved for use in normal operations.

The processing device, at operation 305, reserves the extra valid blocks for the replacement block pool. For example, the processing device can store and maintain a table or other data structure to track memory block designations. In reserving the extra valid blocks for the replacement pool, the processing device can update the table (or other data structure) to indicate that the extra valid blocks are dedicated for use in the replacement pool.

The processing devices identifies one or more free blocks in the memory device (at operation 415). To identify a free block, the processing device identifies a currently unused block (e.g., a block that is empty and unallocated). The processing device can identify such blocks based on a look-up table or other data structure.

At operation 420, the processing device reserves free blocks in the memory device for the replacement block pool. As with the extra valid blocks, the processing device reserves the free blocks for the replacement block pool by updating a table or other data structure to indicate that the free blocks are designated as being part of the replacement block pool. Consistent with some embodiments, the operations 415 and 420 may only be performed upon determining that there are no extra valid blocks remaining. That is, the processing device may add free blocks to the replacement pool upon determining that the number of valid block in the memory device is the minimum number of valid blocks for the memory device.

Returning to FIG. 3, at operation 310, the processing device detects a GBB in the memory device. As previously discussed, the GBB is an invalid block in the memory device (e.g., a failed block). The processing device can detect the GBB in the memory device based on an indicator stored by the GBB or an indication provided by a component of the memory block (e.g., the local media controller 135). For example, a GBB can be identified based on errors output to a status register in response to attempts to program or erase data on the block. In another example, the GBB can be identified by reading data from a dedicated area on the GBB that indicates that the GBB is invalid.

The processing device replaces the GBB with a replacement block from the replacement block pool, at operation 315. To replace the GBB with the replacement block, the processing device copies data stored in the GBB into the replacement block and remaps associations between the logical addresses previously mapped to physical addresses of the GBB. That is, the processing device remaps one or more logical addresses to one or more physical addresses of the replacement block. For example, the processing device can maintain a look-up table that includes address translations between LBAs and PBAs, and the processing device can update the look-up table to map LBAs corresponding to the data copied from the GBB to PBAs corresponding to the replacement block.

As noted above, the GBB may include an array of SLCs or MLCs. In some embodiments, replacement blocks in the replacement block pool are shared between SLC and MLC memory blocks such that either MLC or SLC memory blocks can be replaced with any replacement block in the replacement pool, as needed.

In some embodiments, a first set of replacement blocks can be designated to replace SLC blocks and a second set of replacement block can be designated to replace MLC blocks. Consistent with these embodiments, replacement blocks in the replacement pool can be allocated to either SLC or MLC blocks and replacement blocks can only replace memory blocks of the type (SLC or MLC) to which they are allocated. For example, with a replacement pool of five replacement blocks, two replacement blocks may be allocated to replace SLC GBBs and three replacement blocks may be allocated to MLC GBBs. In some instances, one or more blocks may be unallocated and used to replace either SLC or MLC blocks. Returning to the example of a five-block replacement block pool, two blocks can be allocated for SLC blocks, two blocks can be allocated for MLC blocks, and one block can be left unallocated. In some embodiments, two replacement pools can be maintained—a first replacement pool for SLC blocks and a second replacement pool for MLC blocks.

Consistent with embodiments in which a first set of replacement blocks is designated to replace SLC blocks and a second set of replacement block is designated to replace MLC blocks, the processing device can replace the GBB with a replacement block from the first set of replacement blocks if the GBB is an SLC block. If the GBB is an MLC block, the processing device replaces it with a replacement block from the second set of replacement blocks.

At operation 320, the processing device optionally determines the replacement pool is empty. It shall be appreciated that the operation 320 may, in some embodiments, not be performed prior to operation 325 and may not be performed at all as part of method 300.

At operation 325, the processing device determines whether there are any additional replacement blocks available in the memory device. In determining whether there are any additional replacement blocks, the processing device can determine whether there are any additional extra valid blocks remaining. If there are not any additional extra valid blocks remaining, the processing device determines whether there are any additional free blocks in the processing device.

If the processing device identifies an additional replacement block, the processing device adds the additional replacement block to the replacement block pool, at operation 330. That is, if there is at least one extra valid block remaining (i.e., there are one or more valid blocks in excess of the minimum number of valid blocks), the processing device adds an extra valid block to the replacement block pool. If there are no extra valid blocks, the processing device adds a free block to the replacement pool.

In response to determining that the replacement block pool is empty and that there are no additional replacement blocks in the memory device, the processing device places the memory device in a read-only mode (operation 335). While in read-only mode, only read operations directed at the memory device are permitted while write, modify, and delete operations are prevented.

As shown in FIG. 5, the method 300 can, in some embodiments, include operations 505, 510, and 515. Consistent with these embodiments, the operations 505, 510, and 515 can be performed as part of operation 315 where the processing device replaces the GBB with a replacement block. At operation 505, the processing device determines whether there is an extra valid block in the replacement block pool. If there is an extra valid block, the processing device replaces the GBB with the extra valid block, at operation 510. If there are no extra valid blocks remaining in the replacement block pool, the processing device replaces the GBB with a free block in the replacement block pool.

EXAMPLES

Example 1 is a memory sub-system comprising: a memory device comprising a set of valid blocks; and a processing device, operatively coupled with the memory device, to perform operations comprising: establishing a replacement block pool comprising one or more valid blocks from the set of valid blocks determined based on a constraint defining a minimum number of valid blocks for the memory device; detecting a grown bad block in the set of valid blocks of the memory device; and in response to detecting the grown bad block, replacing the grown bad block with a replacement block from the replacement block pool.

Example 2 includes the memory sub-system of Example 1, wherein the replacing the grown bad block comprises: determining whether the replacement block pool comprises at least one extra valid block.

Example 3 includes the memory sub-system of any one or more of Examples 1 or 2, wherein the replacing the grown bad block further comprises: replacing the grown bad block with an extra valid block in response to determining the replacement block pool comprises at least one extra valid block.

Example 4 includes the memory sub-system of any one or more of Examples 1-3, wherein the replacing the grown bad block further comprises: in response to determining the replacement block pool does not include any extra valid blocks, replacing the grown bad block with an unused block from the set of valid blocks.

Example 5 includes the memory sub-system of any one or more of Examples 1-4, wherein the operations further comprise: determining the replacement block pool is empty; determining no additional replacement blocks are available in the memory device; and in response to determining the replacement block pool is empty and there are no additional replacement blocks available, placing the memory device in a read-only mode.

Example 6 includes the memory sub-system of any one or more of Examples 1-5, wherein the operations further comprise: determining the replacement block pool is empty; in response to determining the replacement block pool is empty, identifying an additional replacement block in the memory device to add to the replacement block pool; and adding the additional replacement block to the replacement block pool.

Example 7 includes the memory sub-system of any one or more of Examples 1-6, wherein the operations further comprise: based on replacing the grown bad block with a replacement block from the replacement block pool, identifying an additional replacement block in the memory device to add to the replacement block pool; and adding the additional replacement block to the replacement block pool.

Example 8 includes the memory sub-system of any one or more of Examples 1-7, wherein the replacement block pool comprises: a first set of replacement blocks dedicated for replacing single level cell (SLC) blocks; and a second set of replacement blocks dedicated for replacing multi-level cell (MLC) blocks.

Example 9 includes the memory sub-system of any one or more of Examples 1-8, wherein: the grown bad block is a SLC block; and the replacing of the grown bad block with the replacement block from the replacement block pool comprises: selecting the replacement block from the first set of replacement blocks.

Example 10 includes the memory sub-system of any one or more of Examples 1-9, wherein: the grown bad block is an MLC block; and the replacing of the grown bad block with the replacement block from the replacement block pool comprises: selecting the replacement block from the second set of replacement blocks.

Example 11 includes the memory sub-system of any one or more of Examples 1-10, the replacement block pool comprises a third set of replacement blocks dedicated for replacing either SLC or MLC blocks; and the replacing of the grown bad block with the replacement block from the replacement block pool comprises: selecting the replacement block from the third set of replacement blocks.

Example 12 includes the memory sub-system of any one or more of Examples 1-11, wherein the one or more valid blocks are identified as being in excess of the minimum number of valid blocks for the memory device.

Example 13 includes the memory sub-system of any one or more of Examples 1-12, wherein the replacing the grown bad block with the replacement block comprises: copying data from the grown bad block to the replacement block; and remapping one or more logical addresses corresponding to the data to one or more physical addresses corresponding to the replacement block.

Example 14 is a method comprising: establishing a replacement block pool for a memory device, the replacement block comprising one or more valid blocks from a set of valid blocks of the memory device determined based on a constraint defining a minimum number of valid blocks for the memory device, the establishing of the replacement block pool comprising reserving the one or more valid blocks for the replacement block pool; detecting a grown bad block in the set of valid blocks of the memory device; and in response to detecting the grown bad block, replacing the grown bad block with a replacement block from the replacement block pool.

Example 15 includes the memory sub-system of any one or more of Examples 1-14, wherein the replacing the grown bad block comprises: determining whether the replacement block pool comprises at least one extra valid block.

Example 16 includes the memory sub-system of any one or more of Examples 1-15, wherein the replacing the grown bad block further comprises: replacing the grown bad block with an extra valid block in response to determining the replacement block pool comprises at least one extra valid block.

Example 17 includes the memory sub-system of any one or more of Examples 1-16, wherein the replacing the grown bad block further comprises: in response to determining the replacement block pool does not include any extra valid blocks, replacing the grown bad block with an unused block from the set of valid blocks.

Example 18 includes the memory sub-system of any one or more of Examples 1-17, the method of Example 14, further comprising: determining the replacement block pool is empty; determining no additional replacement blocks are available in the memory device; and in response to determining the replacement block pool is empty and there are no additional replacement blocks available, placing the memory device in a read-only mode.

Example 19 includes the memory sub-system of any one or more of Examples 1-19, further comprising: identifying an additional replacement block in the memory device to add to the replacement block pool; and adding the additional replacement block to the replacement block pool.

Example 20 is a non-transitory computer-readable storage medium comprising instructions that, when executed by a processing device, configure the processing device to perform operations comprising: reserving one or more valid blocks from a set of valid blocks of a memory device for a replacement block pool for the memory device, the one or more valid blocks determined based on a constraint defining a minimum number of valid blocks for the memory device; detecting a grown bad block in the set of valid blocks of the memory device; and in response to detecting the grown bad block, replacing the grown bad block with a replacement block from the replacement block pool.

Figure 6:
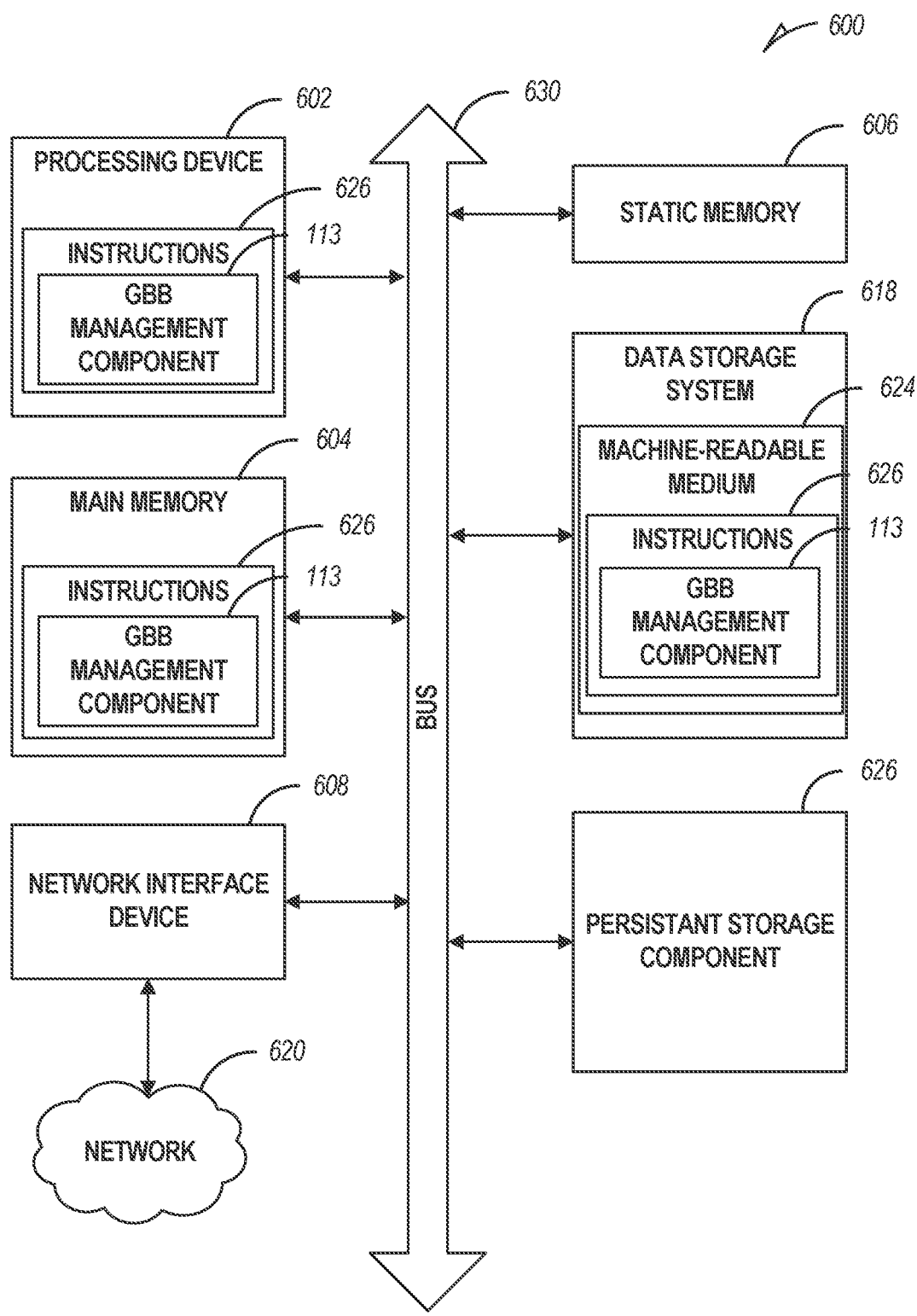
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the GBB management component 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a data destruction component (e.g., the GBB management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A memory sub-system comprising:
   a memory device comprising a set of valid blocks and at least one free block that is unallocated and unused; and
   a processing device, operatively coupled with the memory device, to perform operations comprising:
   establishing a replacement block pool comprising the at least one free block and at least one extra valid block from the set of valid blocks that is in excess of minimum number of valid blocks for the memory device defined by a constraint;
   detecting a grown bad block in the memory device; and
   in response to detecting the grown bad block, replacing the grown bad block in the memory device with a replacement block from the replacement block pool.

2. The memory sub-system of claim 1, wherein the replacing the grown bad block comprises:
   determining whether the replacement block pool comprises at least one extra valid block.

3. The memory sub-system of claim 2, wherein the replacing the grown bad block further comprises:
   replacing the grown bad block with an extra valid block in response to determining the replacement block pool comprises at least one extra valid block.

4. The memory sub-system of claim 2, wherein the replacing the grown bad block further comprises:
   in response to determining the replacement block pool does not include any extra valid blocks, replacing the grown bad block with an unused block from the set of valid blocks.

5. The memory sub-system of claim 1, wherein the operations further comprise:
   determining the replacement block pool is empty;
   determining no additional replacement blocks are available in the memory device; and
   in response to determining the replacement block pool is empty and there are no additional replacement blocks available, placing the memory device in a read-only mode.

6. The memory sub-system of claim 1, wherein the operations further comprise:
   determining the replacement block pool is empty;
   in response to determining the replacement block pool is empty, identifying an additional replacement block in the memory device to add to the replacement block pool; and
   adding the additional replacement block to the replacement block pool.

7. The memory sub-system of claim 1, wherein the operations further comprise:
   based on replacing the grown bad block with a replacement block from the replacement block pool, identifying an additional replacement block in the memory device to add to the replacement block pool; and
   adding the additional replacement block to the replacement block pool.

8. The memory sub-system of claim 1, wherein the replacement block pool comprises:
   a first set of replacement blocks dedicated for replacing single level cell (SLC) blocks; and
   a second set of replacement blocks dedicated for replacing multi-level cell (MLC) blocks.

9. The memory sub-system of claim 8, wherein:
   the grown bad block is a SLC block; and
   the replacing of the grown bad block with the replacement block from the replacement block pool comprises:
   selecting the replacement block from the first set of replacement blocks.

10. The memory sub-system of claim 8, wherein:
    the grown bad block is an MLC block; and
    the replacing of the grown bad block with the replacement block from the replacement block pool comprises:
    selecting the replacement block from the second set of replacement blocks.

11. The memory sub-system of claim 8, wherein:
    the replacement block pool comprises a third set of replacement blocks dedicated for replacing either SLC or MLC blocks; and
    the replacing of the grown bad block with the replacement block from the replacement block pool comprises:
    selecting the replacement block from the third set of replacement blocks.

12. The memory sub-system of claim 1, wherein the grown bad block comprises a failed or defective block.

13. A method comprising:
    establishing, by a processing device, a replacement block pool for a memory device, the replacement block pool comprising at least one free block that is unallocated and unused and at least one extra valid block from a set of valid memory blocks of the memory device that is in excess of minimum number of valid blocks for the memory device defined by a constraint;
    detecting a grown bad block in the memory device; and
    in response to detecting the grown bad block, replacing, by the processing device, the grown bad block in the memory device with a replacement block from the replacement block pool.

14. The method of claim 13, wherein the replacing the grown bad block comprises:
    determining whether the replacement block pool comprises at least one extra valid block.

15. The method of claim 14, wherein the replacing the grown bad block further comprises:
    replacing the grown bad block with an extra valid block in response to determining the replacement block pool comprises at least one extra valid block.

16. The method of claim 14, wherein the replacing the grown bad block further comprises:
    in response to determining the replacement block pool does not include any extra valid blocks, replacing the grown bad block with an unused block from the set of valid blocks.

17. The method of claim 13, further comprising:
    determining the replacement block pool is empty;
    determining no additional replacement blocks are available in the memory device; and
    in response to determining the replacement block pool is empty and there are no additional replacement blocks available, placing the memory device in a read-only mode.

18. The method of claim 14, further comprising:
    identifying an additional replacement block in the memory device to add to the replacement block pool; and
    adding the additional replacement block to the replacement block pool.

19. The method of claim 13, wherein the detecting of the grown bad block comprising one of:
    detecting a failed block in the memory device; and
    detecting a defective block in the memory device.

20. A non-transitory computer-readable storage medium comprising instructions that, when executed by a processing device, configure the processing device to perform operations comprising:

establishing a replacement block pool for a memory device, the replacement block pool comprising at least one free block that is unallocated and unused and at least one extra valid block from a set of valid memory blocks of the memory device that is in excess of minimum number of valid blocks for the memory device defined by a constraint;

detecting a grown bad block in the memory device; and in response to detecting the grown bad block, replacing the grown bad block in the memory device with a replacement block from the replacement block pool.

* * * * *